(12) United States Patent
Nagoya

(10) Patent No.: US 6,671,840 B1
(45) Date of Patent: Dec. 30, 2003

(54) COMMUNICATION SYSTEM WITH BOUNDARY SCAN ELEMENTS

(75) Inventor: Mitsugu Nagoya, Tokyo (JP)

(73) Assignees: Mitsugu Nagya, Tokyo (JP); Koken Co., Ltd., Tokyo (JP)

( * ) Notice: Subject to any disclaimer, the term of this patent is extended or adjusted under 35 U.S.C. 154(b) by 0 days.

(21) Appl. No.: 09/424,453

(22) PCT Filed: Jun. 1, 1998

(86) PCT No.: PCT/JP98/02404

§ 371 (c)(1),
(2), (4) Date: Nov. 23, 1999

(87) PCT Pub. No.: WO98/58317

PCT Pub. Date: Dec. 23, 1998

(30) Foreign Application Priority Data

Jun. 2, 1997 (JP) .............................. 9-143804

(51) Int. Cl.[7] .............................................. G01R 31/28
(52) U.S. Cl. ...................................................... 714/727
(58) Field of Search ................................ 714/726, 727, 714/729

(56) References Cited

U.S. PATENT DOCUMENTS

| | | | | |
|---|---|---|---|---|
| 5,130,988 A | * | 7/1992 | Wilcox et al. | 714/727 |
| 5,132,635 A | * | 7/1992 | Kennedy | 324/763 |
| 5,333,139 A | * | 7/1994 | Sturges | 714/727 |
| 5,450,415 A | * | 9/1995 | Kamada | 714/727 |
| 5,487,074 A | * | 1/1996 | Sullivan | 714/727 |
| 5,488,614 A | * | 1/1996 | Shima | 714/727 |
| 5,544,309 A | * | 8/1996 | Chang et al. | 714/30 |
| 5,617,420 A | | 4/1997 | Whetsel | |

FOREIGN PATENT DOCUMENTS

| | | |
|---|---|---|
| EP | 0 559 209 | 9/1993 |
| JP | 1-229982 | 9/1989 |
| JP | 2-268281 | 11/1990 |
| JP | 6-300821 | 10/1994 |
| JP | 8-226954 | 9/1996 |

* cited by examiner

*Primary Examiner*—David Ton
*Assistant Examiner*—Esaw Abraham
(74) *Attorney, Agent, or Firm*—Kanesaka & Takeuchi

(57) ABSTRACT

A communication system includes boundary scan elements each having a plurality of boundary cells individually assigned to respective input terminals and output terminals, a TAP circuit for controlling input and output of data, a TDI terminal and TDO terminal for inputting or outputting serial data, a TCK terminal to which a clock signal is input, and a TMS terminal to which a mode signal for switching the operation mode is input; a plurality of terminal units connected with the respective boundary scan elements; and a communication controller connected in series with the boundary scan elements for individual control of the terminal units. Incoming communication lines between the boundary scan elements adjoining each other, and between the boundary scan elements and the communication controller, and an outgoing communication line between the communication controller and the boundary scan element positioned at the backmost are formed.

3 Claims, 8 Drawing Sheets

COMMUNICATION SYSTEM WITH BOUNDARY SCAN ELEMENTS

This application is a 371 of PCT/JP98/02404.

TECHNICAL FIELD

The present invention relates to a communication system for controlling terminal units through boundary scan elements, and particularly to a communication system capable of coping with breakage of communication lines.

BACKGROUND OF THE INVENTION

A boundary scan test method has been proposed as one of the inspection methods, with a plurality of IC chips arranged over a printed wire board with printed wiring formed thereon, to see whether or not connection between each IC chip and each printed wiring is properly made and whether or not each printed wiring is broken.

This boundary scan test method can be applied to integrated circuits (IC chips) into which boundary scan elements are incorporated. The boundary scan element, for example as shown in FIG. 4, includes a plurality of boundary cells 214 individually provided between input/output terminals of an internal logic circuit 211 for implementing the inherent functions of the integrated circuit 210 and input terminals 212 and output terminals 213 of the integrated circuit 210, a TAP controller (TAP circuits) 219 for controlling input and output of data to or from the boundary cells 214, a TDI terminal 220 for receiving test data, a TDO terminal for transmitting test data, a TCK terminal 222 into which a clock signal is input, and a TMS terminal 223 for receiving a mode signal for switching the operation mode of the TAP controller 219, and, if required, is further provided with a bypass register 215, an ID CODE register 216, an instruction register 217, a TRS terminal 224 for receiving a reset signal, or the like. The bypass register 215 is to transfer communication data without being passed through the boundary cells, the ID CODE register 216 outputs an individually-assigned ID CODE to identify the source of the communication data, and the instruction register 217 decodes specific data among the communication data to carry out the transition or the like of the operation mode independent of a TMS signal. In this connection, the bypass register 215 to instruction register 217 are referred to as boundary scan register (218).

To describe the respective terminals or the signals to be input/output through the respective terminals in detail, TDI (Test Data In) is a signal for serial-inputting instructions and data to a test logic, and is sampled at rising edges of TCK. TDO (Test Data Out) is a signal for serial-outputting data from the test logic, the output value being changed at falling edges of TCK. TCK (Test Clock) supplies a clock to the test logic. It is a dedicated input for enabling the use of a serial test data path independent of the system clock inherent to the component. TMS (Test Mode Select) is a signal for controlling the test operation, and is sampled at rising edges of TCK. The TAP controller decodes this signal. TRST (Test Reset) is a negative logic symbol for asynchronously initializing the TAP controller, and is optional.

The integrated circuit 210 into which such boundary scan element is incorporated can run a test on the operating state thereof and the connecting relationship between this integrated circuit 210 and external devices, by the procedures described below.

First, in checking the quality of the internal logic 211 of the integrated circuit 210, serial data (test data) are input to the TDI terminal 220 of the integrated circuit 210 as they are shifted, and thereby the test data are set into respective boundary cells 214 corresponding to respective input terminals 212. In this state, the integrated circuit 210 is operated before the data set in the respective boundary cells 214 corresponding to respective output terminals 213 are shifted for output from the TDO terminal 221, and, on the basis of the corresponding relationship between the serial data (test result data) thus obtained and the test data input to this integrated circuit 210, the internal logic 211 of the integrated circuit 210 is tested for its quality.

The boundary scan test method can also be carried out on a plurality of integrated circuits as long as the boundary scan elements are incorporated therein.

For example, a plurality of integrated circuits 210 mounted on a substrate 226 as shown in FIG. 5 can also be subjected to a test for breakage and the like of the printed patterns between the integrated circuits 210, along with a test on the integrated circuits 210 themselves.

In this case, the respective boundary scan elements incorporated in the plurality of integrated circuits 210 are connected in series with each other. Specifically, the TDO terminal 221 of the first integrated circuit 210 (the left in the drawing) and the TDI terminal 220 of the second integrated circuit 210 (the right in the drawing) are connected with each other, the output terminal 229 of a boundary scan controller board 228 provided in host computer unit 227 or the like and the TDI terminal 220 of the first integrated circuit 210 are connected with each other, and the input terminal 230 of the boundary scan controller board 228 and the TDO terminal 221 of the second integrated circuit 210 are connected with each other. The test procedures are as follows:

In testing breakage, short circuit, and the like of the printed patterns, a test data preparing tool 231 or the like is used to prepare test data (serial data), which is output from the output terminal 229 of the boundary scan controller board 228 and is input to the TDI terminal 220 of the first integrated circuit 210 while shifted, setting the test data into the respective boundary cells 214 corresponding to the respective output terminals 213 in this integrated circuit 210. In this state, the data stored in these respective boundary cells 214 are output from the respective output terminals 213 provided in the first integrated circuit 210 as shown in FIG. 6, and are input through the respective printed patterns 233 constituting a system bus and the like to the respective input terminals 212 of the second integrated circuit 210, and further captured into the respective boundary cells 214 corresponding to these respective input terminals 212.

Thereafter, the data stored in the respective boundary cells 214 of these respective integrated circuits 210 are shifted and captured through the input terminal 230 of the boundary scan controller board 228 as they are analyzed by using a test result analyzing tool 232 or the like, so that a test can be made for breakage, short circuit, and the like in such a test range 235 as the printed patterns 233 providing connection between the integrated circuits 210.

Next, in inspecting the internal logic 211 of the respective integrated circuits 210, test data are output from the output terminal 229 of the boundary scan controller board 228, and are input to the TDI terminal 220 of the first integrated circuit 210 as they are shifted, so as to be set into the respective boundary cells 214 corresponding to the respective input terminals 212 of this integrated circuit 210 as shown in FIG. 6.

Subsequently, this integrated circuit 210 is operated, and the resulting data are captured into the respective boundary cells 214 corresponding to the respective output terminals 213 before the data stored in these respective boundary cells 214 are shifted for output from the TDO terminal 221 of the first integrated circuit 210. Here, the second integrated circuit 210 is brought into a bypass state as shown in FIG. 7 by the boundary scan controller board 228, so that the data output from the TDO terminal 221 are bypassed through the second integrated circuit 210 and captured through the input terminal 230 of the boundary scan controller board 228. Then, the test analyzing tools 232 or the like can be used for analysis of the captured data to test whether or not the first integrated circuit 210 operates properly.

Next, in the cases of inspecting the second integrated circuit 210, the boundary scan controller board 228 similarly brings the first integrated circuit 210 into a bypass state as shown in FIG. 7 before test data are output from the output terminal 229 of the boundary scan controller board 228 and bypassed through the first integrated circuit 210. Then, the test data are input to the TDI terminal 220 of the second integrated circuit 210 while shifted, to be set into the respective boundary cells 214 corresponding to the respective input terminals 212 of this integrated circuit 210 as shown in FIG. 8. Subsequently, this integrated circuit 210 is operated, and the resulting data are captured into the respective boundary cells 214 corresponding to the respective output terminals 213. Thereafter, the data stored in the respective boundary cells 214 are shifted for output from the TDO terminal 221, and further they are captured through the input terminal 230 of the boundary scan controller board 228. Then, the captured data can be analyzed by using the test result analyzing tool 232 and the like, so as to test whether or not the second integrated circuit 210 operates properly.

In this way, a substrate 226, as long as using integrated circuits 210 into which boundary scan elements are incorporated, can be tested for the quality of the respective integrated circuits 210 themselves, and on the connecting relationship between the integrated circuits 210 and the like by implementing the boundary scan test, method.

Now, it was found by the present inventor that when integrated circuits into which such boundary scan elements are incorporated are used to constitute the substrate or the like of a sensor module, input and output of serial data can be made to or from the respective integrated circuits mounted on the substrate 226 at a speed on the order of 20 Mbps without the use of communication integrated circuits or the like.

Then, a communication system was proposed which applies the boundary scan elements to carry out communication with host computer units and the like without the use of communication devices.

FIG. 9 is a block diagram showing an example of the communication system to which the boundary scan elements are applied.

The communication system 240 shown in this figure comprises: a communication controller unit 241 for carrying out the transmitting, collection, and the like of communication data; a plurality of sensor units 242a–242c for carrying out the monitoring of an object to be monitored; a plurality of boundary scan elements 243a–243c provided for each of these sensor units 242a–242c, the boundary scan elements carrying out such processing as capturing the control data output from the aforesaid communication controller unit 241 to supply the same to the respective sensor units 242a–242c, and capturing the detected data output from the respective sensor units 242a–242c to supply the same to the aforesaid communication controller unit 241; and communication lines 244 for providing connection between the respective boundary scan elements 243a–243c and the aforesaid communication controller unit 241.

The respective boundary scan elements 243a–243c are connected in series to the communication controller unit 241. Specifically, the connection is made in such a manner that the output terminal 241a of the communication controller unit 241 is connected to the TDI terminal of the boundary scan element 243a, and the TDO terminal of the boundary scan element 243a is connected to the TDI terminal of the next boundary scan element 243b, the TDO terminal of the boundary scan element 243b is connected to the TDI terminal of the boundary scan element 243c, and the TDO terminal of the boundary scan element 243c is connected to the input terminal 241b of the communication controller unit 241.

The function of this communication system 240 is as follows:

The respective boundary scan elements 243a–243c function in synchronization with the clock signal transmitted from the TCK. terminal 241d of the communication controller unit 241, and the operation mode of the respective TAP controllers is switched by the TMS signal transmitted from the TMS terminal 241c of the communication controller unit 241.

In driving the respective sensor units 242a–242c according to the instruction from the host computer unit 245, control data (serial data) are output from the output terminal 241a of the communication controller unit 241, and the data are supplied to the respective boundary scan elements 243a–243c and set into the boundary cells corresponding to the output terminals. Then, the control data set are output from the output terminals, and supplied to the respective sensor units 242a–242c corresponding to the respective boundary scan elements 243a–243c, thereby driving the units.

Moreover, in the cases of collecting the detected data or the like from the respective sensor units 242a–242c according to the instruction from the host computer unit 245, the detected data or the like of the respective sensor units 242a–242c are once set in the boundary cells associated with the input terminals of the corresponding, respective boundary scan elements 243a–243c. Then, the data are output as serial data from the TDO terminals, and captured through the input terminal 241b of the communication controller unit 241.

Such communication system 240, when setting control data into the respective boundary scan elements 243a–243c and when outputting the detected data and the like from the respective boundary scan elements 243a–243c, can be maximized to 20 Mbps in data rate, thereby allowing the transfer of communication data at higher speeds than those of conventional communication systems.

In the communication system 240, however, when the communication line 244 is broken at any point, e.g. between the boundary scan element 243b and the boundary scan element 243c, it becomes impossible for the communication controller unit 241 to obtain communication data from any of the boundary scan elements 243a–243c; besides, it is also difficult to pinpoint the breakage.

SUMMARY OF THE INVENTION

It is an object of the present invention to provide a communication system which uses boundary scan elements capable of coping with the breakage of communication lines.

According to the present invention, there is provided a communication system comprising: a boundary scan element including a plurality of boundary cells individually assigned to respective input terminals and output terminals, a TAP circuit for controlling input and output of data to or from the aforesaid boundary cells, a TDI terminal for inputting serial data to be supplied to the aforesaid boundary cells, a TDO terminal for outputting data from the aforesaid boundary cells as serial data, a TCK terminal to which a clock signal is input, and a TMS terminal to which a mode signal for switching the operation mode of the aforesaid TAP circuit is input; a plurality of terminal units connected with each of the aforesaid boundary scan elements or provided with an IC into which the elements are incorporated; a communication controller, connected in series with the aforesaid boundary scan elements, for transmitting/receiving through the aforesaid boundary scan elements communication data for individually controlling the aforesaid terminal units; and a cable provided to establish connection between the aforesaid boundary scan elements adjoining each other and between the aforesaid boundary scan elements and the aforesaid communication controller, the aforesaid cable being formed by binding up a clock signal line, a mode signal line, an outgoing communication line, and incoming communication lines, wherein the aforesaid incoming communication lines establish individual connection between a data input terminal of the aforesaid communication controller and the aforesaid TDO terminal of the aforesaid boundary scan element directly connected with the aforesaid communication controller through the aforesaid cable, and between the aforesaid TDO terminal and the aforesaid TDI terminal of the aforesaid boundary scan elements adjoining each other, and that the aforesaid outgoing communication line establishes connection between a data output terminal of the aforesaid communication controller and the aforesaid TDI terminal of the aforesaid boundary scan element positioned at the backmost as seen from the aforesaid communication controller.

In this invention, communication data are transferred in the direction from the boundary scan element which is positioned at the backmost as seen from the communication controller to the boundary scan element which is directly connected with the communication controller. Accordingly, even in the cases where breakage of communication lines occurs between the boundary scan elements, the communication data held in the boundary scan element or elements positioned on the communication controller side from the breakage can be transferred to the communication controller, so that the communication controller can identify the presence/absence of breakage and the approximate position of the breakage by the communication data transferred.

Moreover, according to the present invention, there is provided a communication system comprising: a plurality of boundary scan elements including a plurality of boundary cells individually assigned to respective input terminals and output terminals, a TAP circuit for controlling input and output of data to or from the aforesaid boundary cells, a TDI terminal for inputting serial data to be supplied to the aforesaid boundary cells, a TDO terminal for outputting data from the aforesaid boundary cells as serial data, a TCK terminal to which a clock signal is input, and a TMS terminal to which a mode signal for switching the operation mode of the aforesaid TAP circuit is input; a plurality of terminal units (gag connected with the aforesaid boundary scan elements or provided with an IC into which the elements are incorporated; and a communication controller for transmitting/receiving through the aforesaid boundary scan elements communication data for individually controlling the aforesaid terminal units, wherein the aforesaid terminal units each is connected with a boundary scan element group or provided with an IC into which the elements are incorporated, that the aforesaid boundary scan element group including two boundary scan elements having the aforesaid input terminals and the aforesaid output terminals separately connected in parallel, the aforesaid communication controller includes two terminal areas comprising a communication data output terminal for transmitting communication data to the aforesaid boundary scan elements and a communication data input terminal for receiving communication data from the aforesaid boundary scan elements, and that either one of the aforesaid terminal areas and the other of the aforesaid terminal areas are connected in series with either ones one of the aforesaid boundary scan elements in the aforesaid boundary scan element groups and the others of the aforesaid boundary scan elements in the aforesaid boundary scan element groups, respectively, so that the directions of transfer of communication data are opposite to each other.

In this invention, two of the boundary scan elements are assigned to the respective terminal units, and the respective boundary scan elements are connected with the communication controller so that the directions of transfer of communication data are opposite to each other. Therefore, only either one of the boundary scan elements is normally used for communication processing, and when the communication lines suffer breakage, the others of the boundary scan elements are used for communication processing, thereby allowing input and output of communication data to or from all of the terminal units.

In the communication systems of the present invention, the terminal units include various sensor units, such as monitoring camera units. And, in the connection between the terminal units and the boundary scan elements, the output terminals and the input terminals are connected with input terminals of the terminal units and output terminals of the terminal units, respectively, and thereby the data of the boundary cells are output to the terminal units and data are conversely input to the boundary cells.

The communication data include not only the control data to be transmitted to the terminal units in order to control the terminal units, but also data detected by the terminal units to be transmitted from the terminal units and status data such as whether or not the terminal units are driven normally.

BEST MODE FOR EMBODYING THE INVENTION

<<Content of First Embodiment>>

Figure 1:
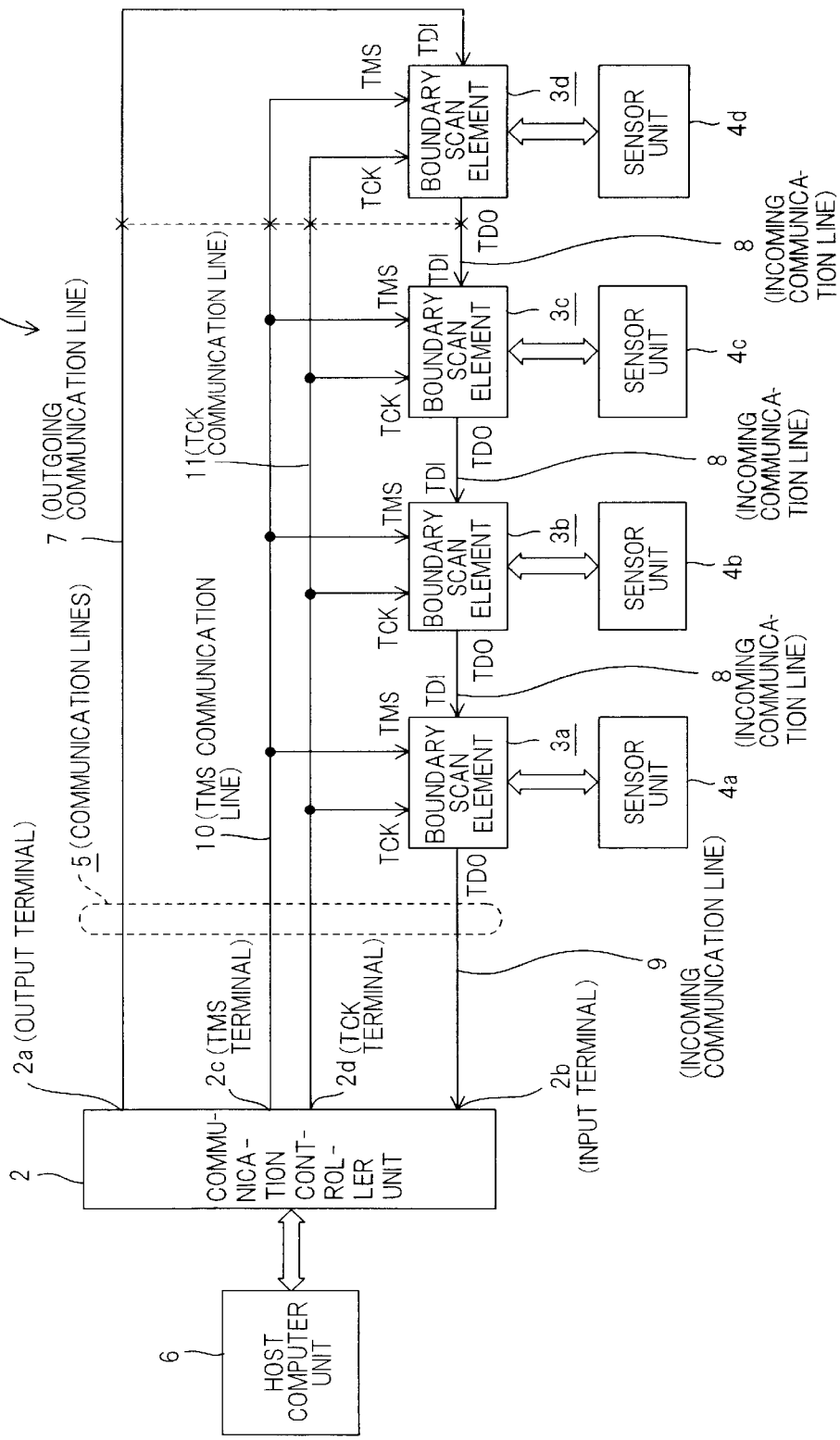
FIG. 1 is a block diagram showing a first embodiment of the communication system of the present invention.

FIG. 1 is a block diagram showing a communication system 1a of the present invention.

The communication system 1a includes a plurality of boundary scan elements 3a–3d, sensor units (terminal units) 4a–4d connected with the respective boundary scan elements 3a–3d, a communication controller unit 2 for controlling the sensor units 4a–4d through the boundary scan elements 3a–3d, and communication lines (cable) 5 for providing connection between the communication controller unit 2 and the boundary scan element 3a and between the adjacent boundary scan elements 3a–3d. Further, the communication controller unit 2 is connected with host computer unit 6.

Figure 4:
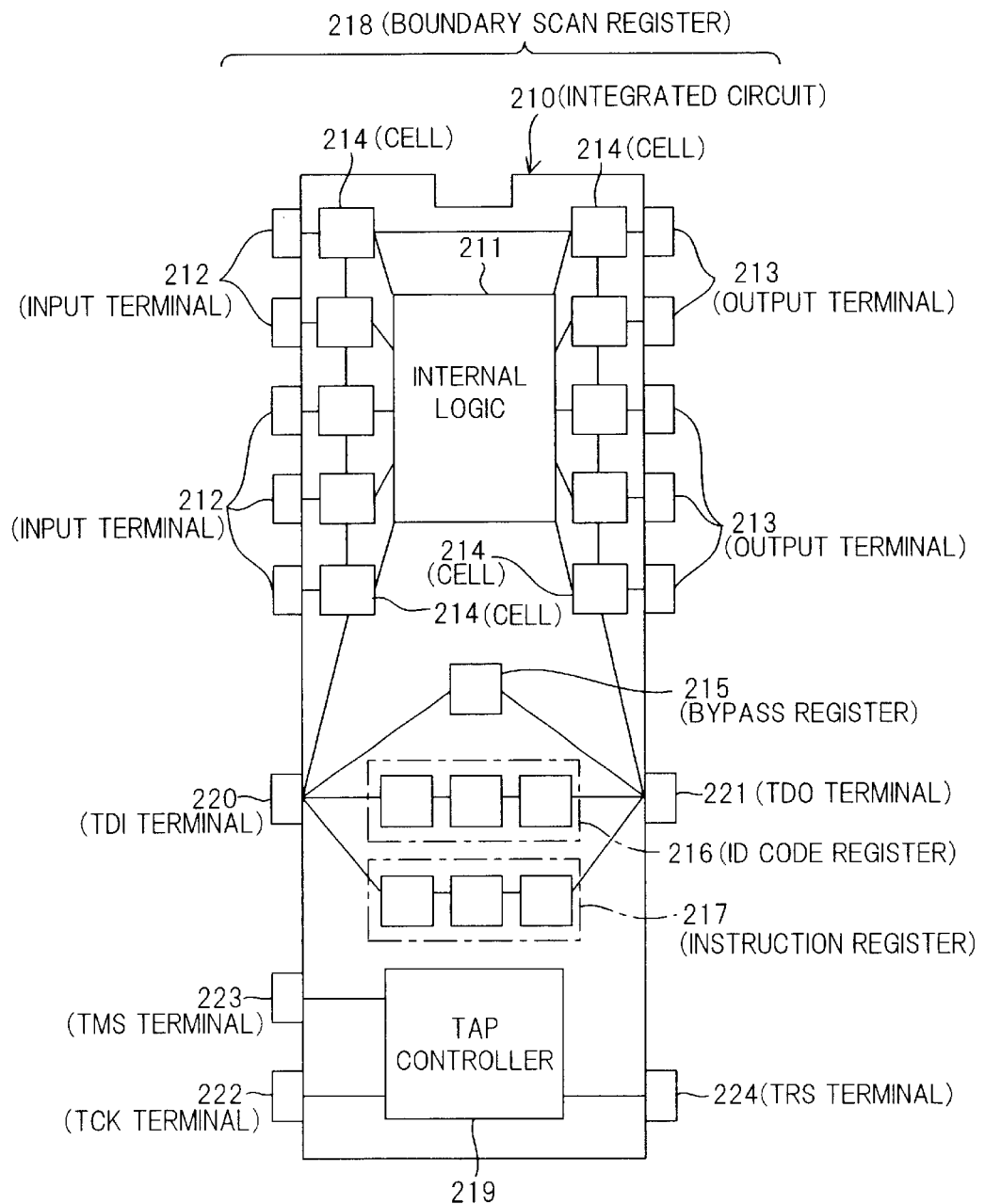
FIG. 4 is a block diagram of a conventional boundary scan element.
Figure 5:
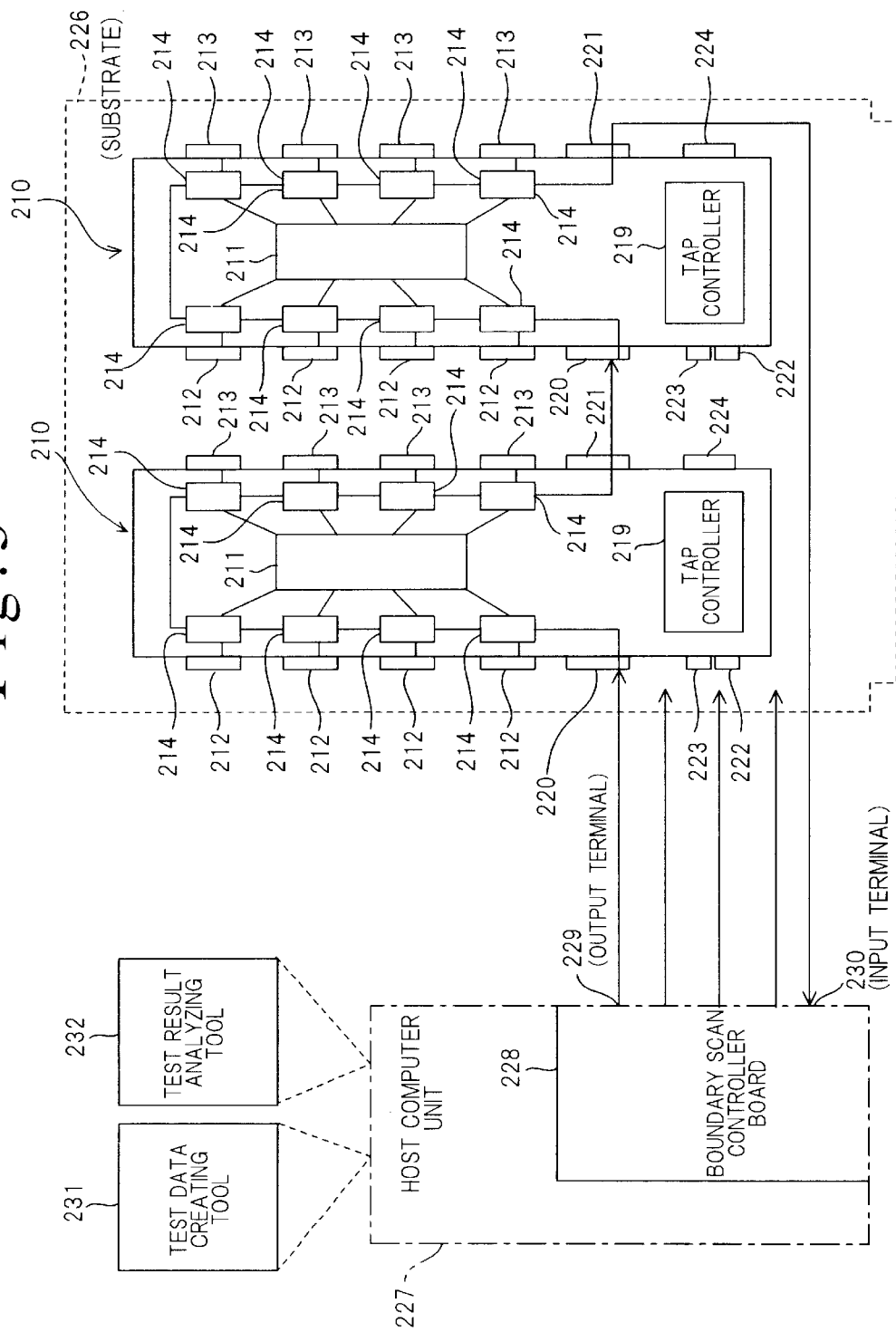
FIG. 5 is a block diagram showing an example of a boundary scan test using the boundary scan element shown in FIG. 4.
Figure 6:
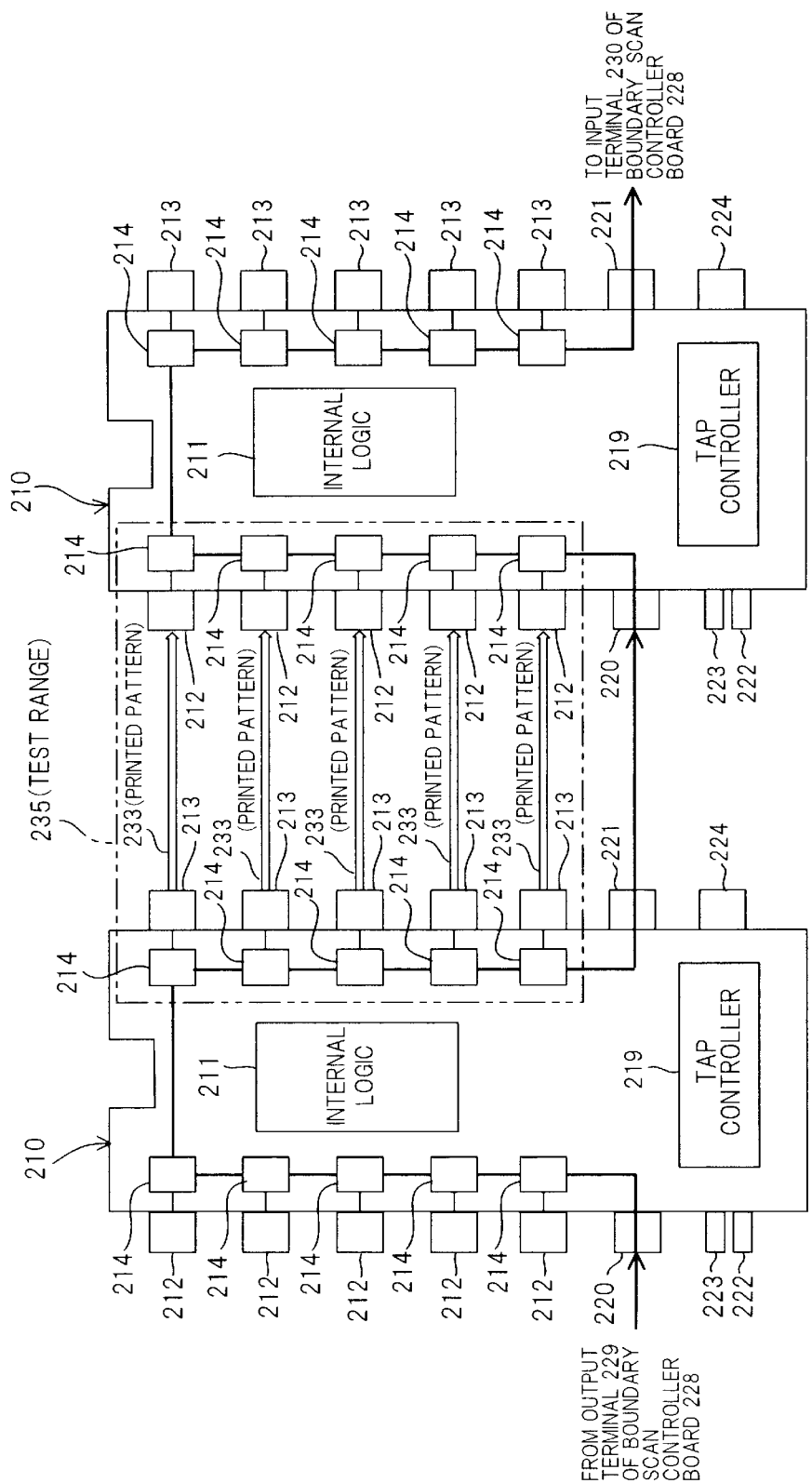
FIG. 6 is a schematic diagram showing an example of a boundary scan test using the boundary scan element shown in FIG. 4.
Figure 7:
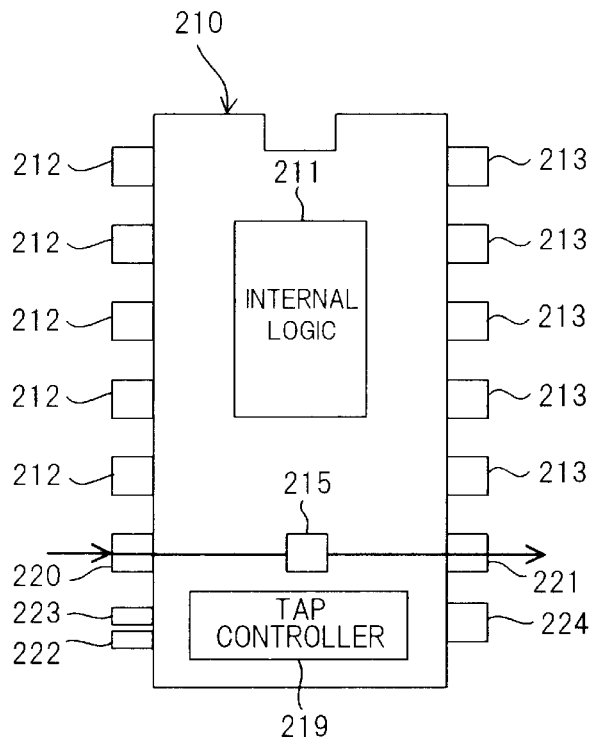
FIG. 7 is a schematic diagram showing an example of a boundary scan test using the boundary scan element shown in FIG. 4.
Figure 8:
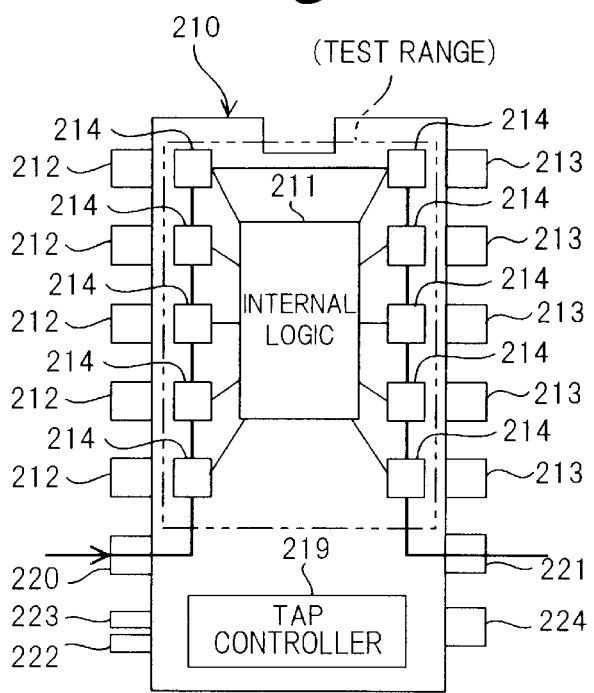
FIG. 8 is a schematic diagram showing an example of a boundary scan test using the boundary scan element shown in FIG. 4.
Figure 9:
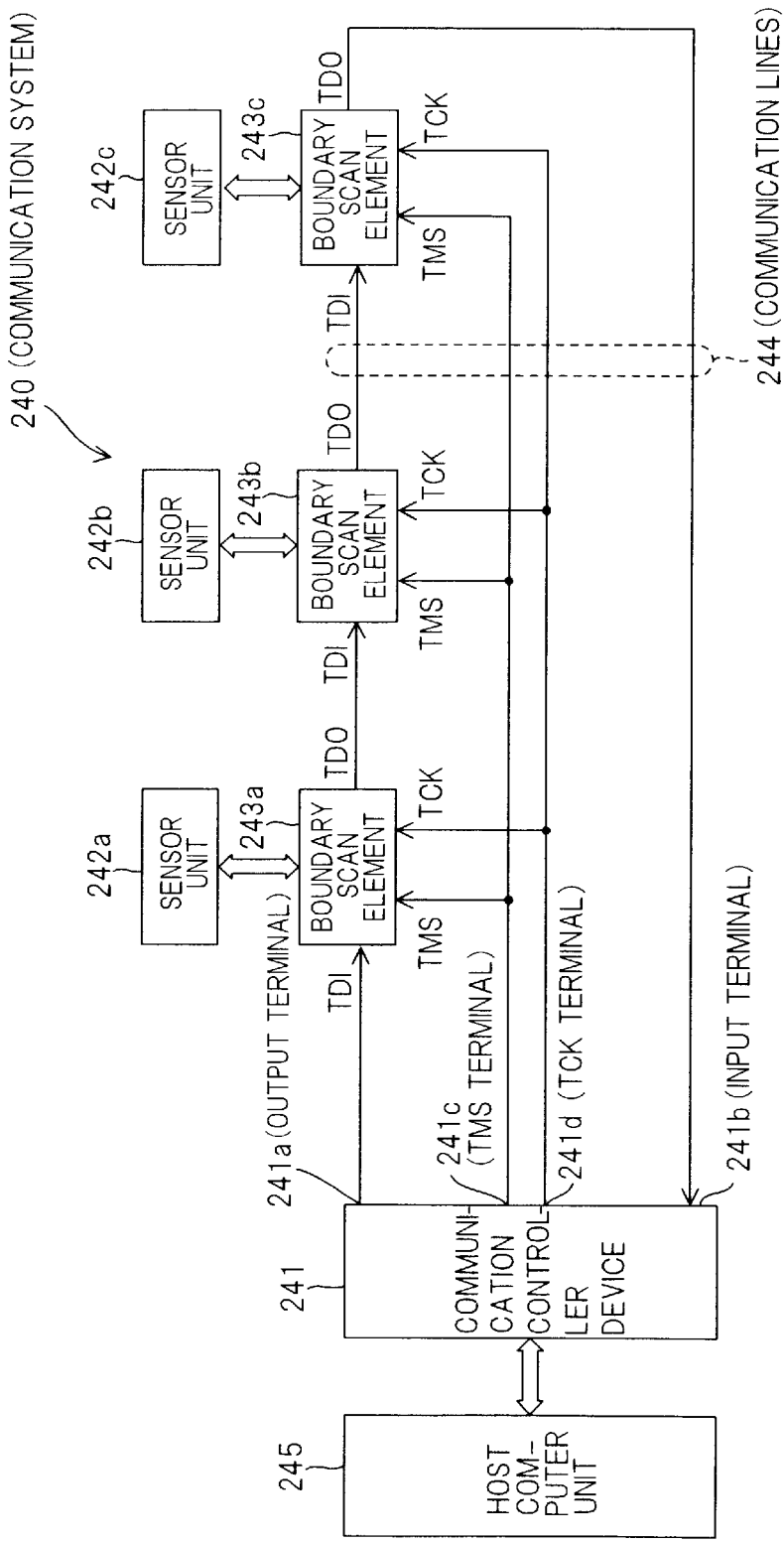
FIG. 9 is a block diagram showing an example of a conventional communication system to which boundary scan elements are applied.

The boundary scan elements 3a–3d have the same configuration as that shown in FIG. 4, and are connected in series with the communication controller unit 2 through the communication lines 5.

In addition, the output terminals and input terminals of the boundary scan elements 3a–3d are connected to the input terminals and output terminals (not shown) of the corresponding sensor units 4a–4d, respectively, so that the communication data set in the boundary cells are transmitted to the sensor units 4a–4d, and the communication data from the sensor units 4a–4d are transmitted to the boundary cells and set therein.

The sensor units 4a–4d are arranged at positions corresponding to objects to be monitored, and comprise various sensors which measure the temperature, pressure, and the like, or monitor circuits or the like which monitor the operating state of a CPU circuit to be monitored. Then, the units carry out the measuring operation or the monitoring operation in accordance with the measuring conditions or monitoring conditions designated by the control data or the like supplied through the boundary scan elements 3a–3d, and transmit the measurement, the monitor results, or the like thus obtained through the boundary scan elements 3a–3d to the communication controller unit 2.

The communication controller unit 2 comprises hardware circuits, microprocessor circuits, and the like, and transmits from the TMS terminal 2c and the TCK terminal 2d a signal required for driving the boundary scan elements 3a–3d in accordance with the content of designation output from the host computer unit 6. The unit 2 also carries out such processing as transmitting from the output terminal 2a control data for controlling the sensor units 4a–4d, receiving through the input terminal 2b the data obtained by the sensor units 4a–4d, and supplying the same to the host computer unit 6.

The communication lines 5 are a cable formed by binding up a TCK communication line 11, a TMS communication line 10, a outgoing communication line 7, and incoming communication lines 8 and 9.

The TCK communication line 11 establishes connection between the TCK terminal 2d of the communication controller unit 2 and the TCK terminals of the respective boundary scan elements 3a–3d, so that the respective boundary scan elements 3a–3d function synchronously. The TMS communication line 10 provides connection between the TMS terminal 2c of the communication controller unit 2 and the TMS terminals of the respective boundary scan elements 3a–3d.

The incoming communication line 9 establishes connection between the input terminal 2b of the communication controller 2 and the TDO terminal of the boundary scan element 3a which is connected directly with the communication controller 2 through the communication lines 5, and the incoming communication lines 8 provide individual connection between the TDO terminals and the TDI terminals of the respective boundary scan elements 3a–3d adjoining each other.

The outgoing communication line 7 provides connection between the data output terminal 2a of the communication controller 2 and the TDI terminal of the boundary scan element 3d which is positioned at the backmost as seen from the communication controller 2, among the boundary scan elements 3a–3d connected in series with the communication controller 2.

Next, description will be made on the function of the communication system 1a of such constitution.

When an instruction to drive the sensor units 4a–4d is transmitted from the host computer unit 6, the control data according to the instruction are prepared in the communication controller unit 2. Then, the communication controller unit 2 transmits a mode signal from the TMS terminal 2c to switch the respective boundary scan elements 3a–3d to a required operation mode, and also transmits the control data through the outgoing communication line 7, so that the control data are set into the boundary cells of the respective boundary scan elements 3a–3d.

Subsequently, the communication controller unit 2 outputs from the TMS terminal 2c a mode signal indicating the output command for the control data, so that the control data set in the boundary cells of the respective boundary scan elements 3a–3d are transmitted to the corresponding sensor unit 4a–4d.

In accordance with the content of the control data received, the sensor units 4a–4d carry out the measuring operation, or the monitoring operation and the like. According to the content of the control data, the sensor units also output the measurement data, the monitor data, or the status data of the sensor units 4a–4d themselves and the like, to the corresponding boundary scan elements 3a–3d.

Next, when an instruction to collect the measurement data and the like of the sensor units 4a–4d is transmitted from the host computer unit 6, the communication controller unit 2 transmits a mode signal from the TMS terminal 2c to switch the respective boundary scan elements 3a–3d to a required operation mode, so that the boundary cells of the respective boundary scan elements 3a–3d are set with the detected data or the like of the measurement data or the like from the corresponding sensor unit 4a–4d. Then, the communication controller unit 2 outputs from the TMS terminal 2c a mode signal indicating the transfer command for communication data, and thereby the detected data and the like set in the boundary cells of the respective boundary scan elements 3a–3d are transferred to the communication controller unit 2. Thereafter, the host computer unit 6 or the communication controller unit 2 carries out the analysis or the like of the detected data and the like received.

Meanwhile, when, in the middle of communication, the communication lines 5 suffer breakage, e.g., the communication lines 5 are broken between the boundary scan elements 3c and 3d, the boundary scan element 3d stops since no clock signal is supplied to the boundary scan element 3d. The remaining boundary scan elements 3a–3c, however, are supplied with the clock signal and the TMS signal, and the incoming communication lines 8 between the boundary scan elements 3a and 3c remain connected; therefore, the communication data set in the boundary scan elements 3a–3c can be transferred to the communication controller unit 2. The communication controller unit 2 identifies the missing of the data of the boundary scan element 3d among the communication data received, thereby ascertaining the presence of breakage and the approximate position of the breakage.

Similarly, the communication controller unit 2 can identify the presence of breakage and the position of the breakage by receiving the communication data set in the boundary scan elements 3a and 3b when breakage occurs between the boundary scan elements 3b and 3c, or by receiving the communication data set in the boundary scan element 3a when breakage occurs between the boundary scan elements 3a and 3b.

In this way, the communication system la of the present invention, despite the similar constitution as those of conventional communication systems, can identify the presence of breakage and the position of the breakage by virtue of the devisal made on its wiring.

<<Content of Second Embodiment>>

Figure 2:
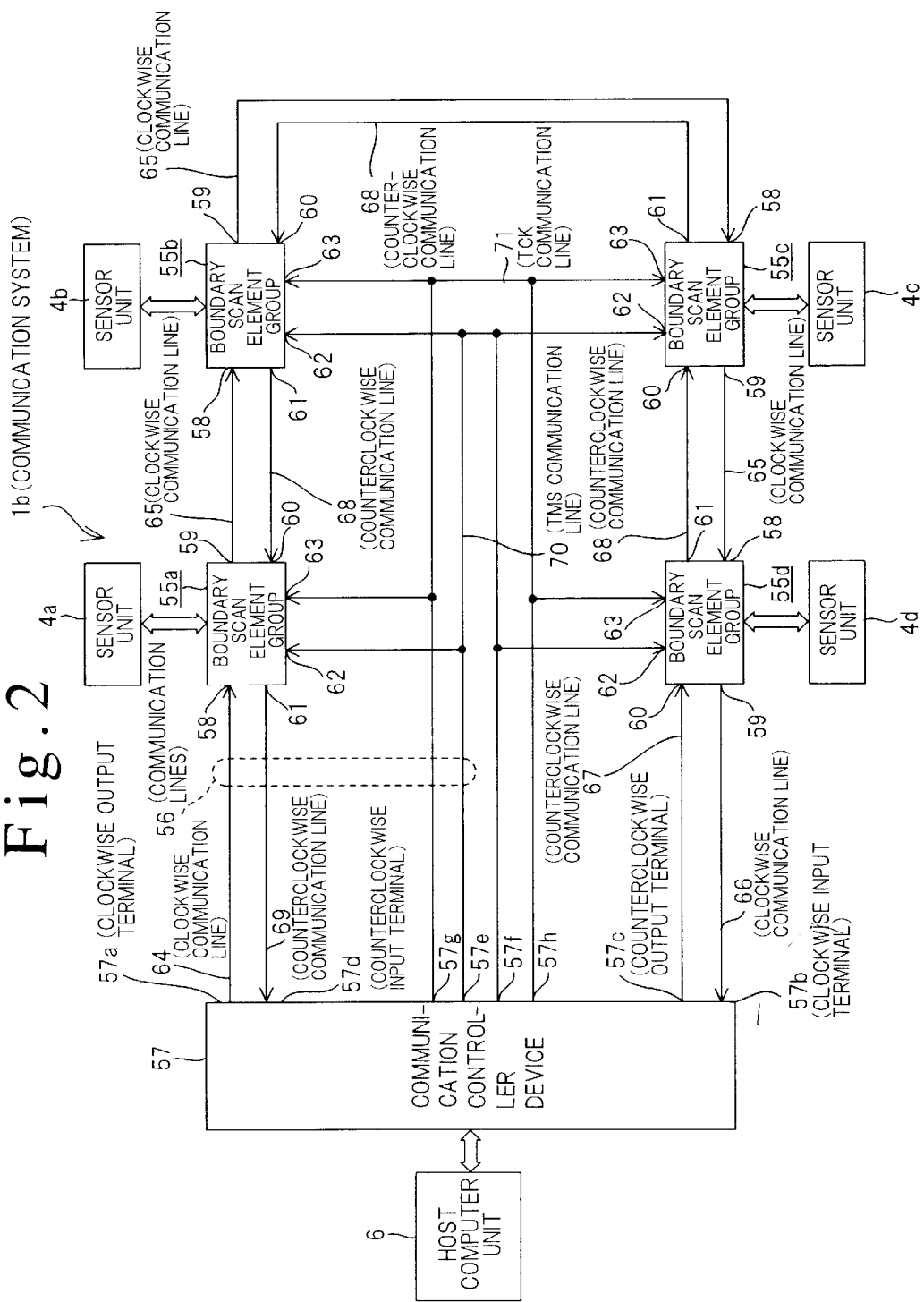
FIG. 2 is a block diagram showing a second embodiment of the communication system of the present invention.

FIG. 2 is a block diagram showing another communication system 1b of the present invention.

The communication system 1b includes a plurality of boundary scan element groups 55a–55d, sensor units 4a–4d connected with the respective boundary scan element groups 55a–55d, and a communication controller unit 57 for controlling the sensor units 4a–4d through the boundary scan element groups 55a–55d. Further, the communication controller unit 57 is connected with host computer unit 6.

Figure 3:
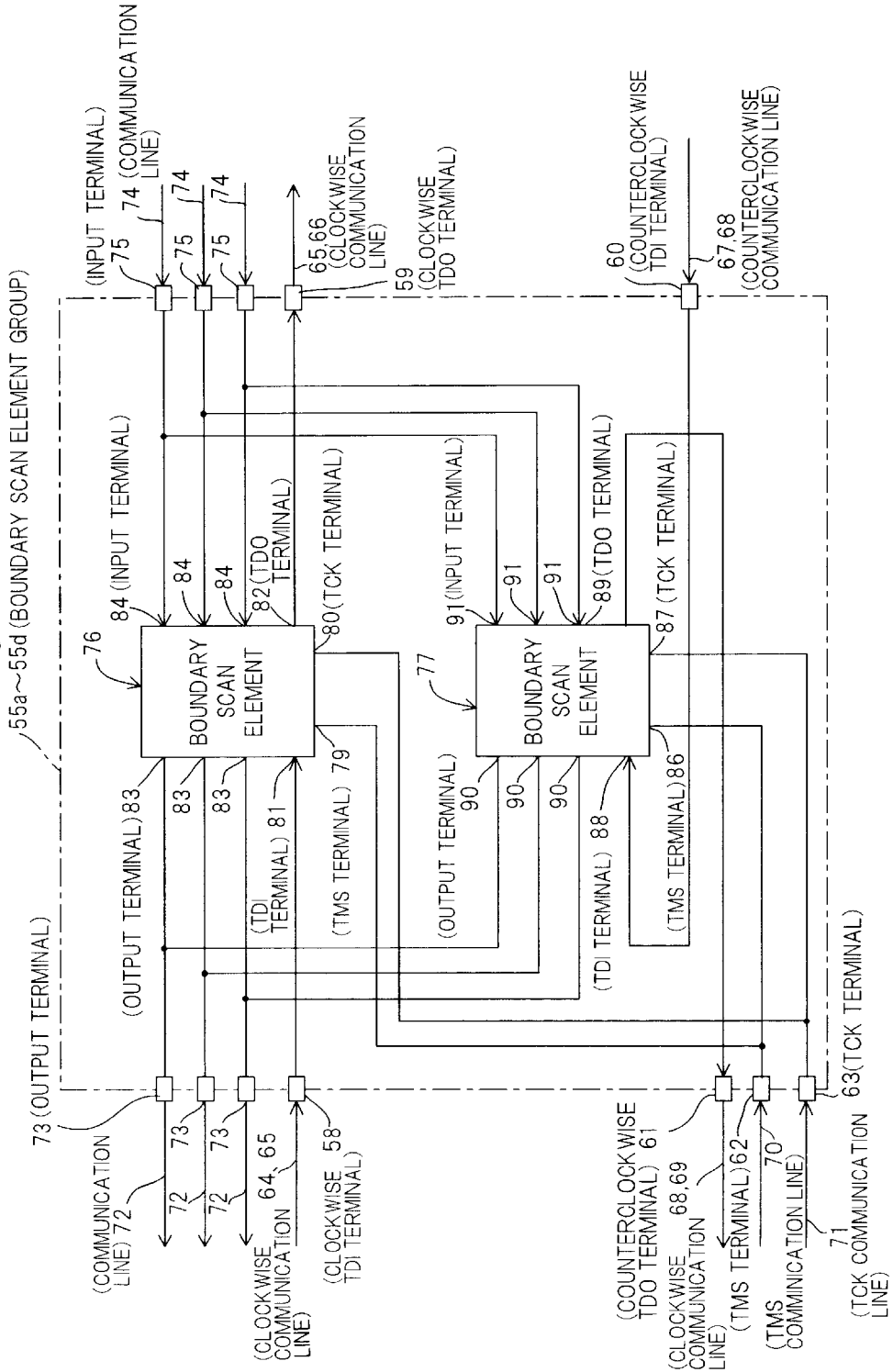
FIG. 3 is a block diagram of a boundary scan element group 55a–55d.

As shown in FIG. 3, each boundary scan element group 55a–55d is a package including: two boundary scan elements 76 and 77; output terminals 73 and input terminals 75 to be connected with the input terminals and output terminals (not shown) of the sensor units 4a–4d, respectively; a clockwise TDI terminal 58 and TDO terminal 59; a counterclockwise TDI terminal 60 and TDO terminal 61; a TMS terminal 62; and a TCK terminal 63.

The boundary scan elements 76 and 77 each has the same configuration as that shown in FIG. 4, and their output terminals 83 and 90, input terminals 84 and 91, TMS terminals 79 and 86, and TCK terminals 80 and 87 are connected in parallel with the respective, corresponding terminals (the output terminals 73, input terminals 75, TMS terminal 62, and TCK terminal 63) of the boundary scan element group 55a–55d.

Accordingly, both of the boundary scan elements 76 and 77 are able to perform input and output of communication data to or from the corresponding sensor unit 4a–4d, and are driven synchronously with each other.

Then, the TDI terminal 81 of the boundary scan element 76 is connected to the clockwise TDI terminal 58 of the boundary scan element group, and the TDO terminal 82 to the clockwise TDO terminal 59; the boundary scan element 76 receives communication data through the clockwise communication lines 64, 65, and 66 only, and transmits communication data therethrough. Similarly, the TDI terminal 88 of the boundary scan element 77 is connected to the counterclockwise TDI terminal 60, and the TDO terminal 89 to the counterclockwise TDO terminal 61; the boundary scan element 77 receives communication data through the counterclockwise communication lines 67, 68, and 69 only, and transmits communication data therethrough.

The sensor units 4a–4d are of the same configuration and function as those of the communication system 1a described above.

The communication controller unit 57 includes hardware circuits, microprocessor circuits, and the like, and transmits, in accordance with the content of designation output from the host computer unit 6, a required signal from either TMS terminal 57e or f and either TCK terminal 57g or h through either the TMS communication line 70 or TMS communication line 71 to the TMS terminals 62 and TCK terminals 63 of the respective boundary scan element groups 55a–55d, thereby driving the respective boundary scan elements 76 and 77 built therein.

The communication controller unit 57 further includes a terminal area composed of a clockwise output terminal 57a and a clockwise input terminal 57b, and a terminal area composed of a counterclockwise output terminal 57c and a counterclockwise input terminal 57d, and carries out such processing as transmitting from the clockwise output terminal 57a and the counterclockwise output terminal 57c control data for controlling the respective sensor units 4a–4d, receiving through the clockwise input terminal 57b and the counterclockwise input terminal 57d the detected data or the status data of the respective sensor units 4a–4d, and supplying the same to the host computer unit 6.

Here, in the communication system 1b, the respective boundary scan elements 76 and the respective boundary scan elements 77 incorporated into the respective boundary scan element groups 55a–55d are connected to the communication controller unit 57 so that the communication data are transferred therethrough in opposite directions.

Specifically, first, all the boundary scan elements 76 are connected in series with the communication controller unit 57 through the clockwise communication lines 64, 65, and 66, and all the boundary scan elements 77 are connected in series with the communication controller unit 57 through the counterclockwise communication lines 67, 68, and 69.

Then, the clockwise output terminal 57a of the communication controller unit 57 is connected through the clockwise communication line 64 to the clockwise TDI terminal 58 of the boundary scan element group 55a, the respective clockwise TDO terminals 59 and the respective clockwise TDI terminals 58 between the boundary scan element groups 55a–55d are connected through the clockwise communication lines 65, and finally the clockwise TDO terminal 59 of the boundary scan element group 55d is connected to the clockwise input terminal 57b of the communication controller unit 57 through the clockwise communication line 66. On this account, the control data transmitted from the clockwise output terminal 57a of the communication controller unit 57 to the respective boundary scan elements 76, or the detected data and status data obtained by the respective boundary scan elements 76 from the respective sensor units 4a–4d are always transferred in the direction of the boundary scan element groups 55a→55b→55c→55d.

Meanwhile, the counterclockwise output terminal 57c of the communication controller unit 57 is connected through the counterclockwise communication line 67 to the counterclockwise TDI terminal 60 of the boundary scan element group 55d, the respective counterclockwise TDO terminals 61 and the respective counterclockwise TDI terminals 60 between the boundary scan element groups 55d–55a are connected through the counterclockwise communication lines 68, and finally the counterclockwise TDO terminal 61 of the boundary scan element group 55a is connected to the counterclockwise input terminal 57d of the communication controller unit 57 through the counterclockwise communication line 69. On this account, the control data transmitted from the counterclockwise output terminal 57c of the communication controller unit 57 to the respective boundary scan elements 77, or the detected data and status data obtained by the respective boundary scan elements 77 from the respective sensor units 4a–4d are always transferred in the direction of the boundary scan element groups 55d→55c→55b→55a.

Next, description will be made on the function of the communication system 1b having such configuration.

For normal communication processing without breakage of the communication lines 56, the communication system 1b carries out the communication processing by driving only the boundary scan elements 76 among the boundary scan elements 76 and 77 in the boundary scan element groups 55a–55d.

That is, when an instruction to drive the sensor units 4a–4d is transmitted from the host computer unit 6, control data according to the instruction are prepared in the communication controller unit 57. Then, the communication controller unit 2 transmits a mode signal from either TMS terminal 57e or f to switch the respective boundary scan elements 76 and 77 to required operation modes, and transmits the control data from the clockwise output terminal 57a through the clockwise communication lines 64 and 65 to the respective boundary scan elements 76, so that the control data are set into the respective boundary scan elements 76.

Next, the communication controller unit 57 transmits from either TMS terminal 57e or f a mode signal indicating the output command for the control data, and thereby the control data set in the respective boundary scan elements 76 are transmitted to the corresponding sensor unit 4a–4d.

In accordance with the content of the control data received, the sensor units 4a–4d carry out the measuring operation, or the monitoring operation and the like. According to the content of the control data, the sensor units also output the measurement data, the monitor data, or the status data of the sensor units 4a–4d themselves and the like to the corresponding boundary scan elements 76.

Subsequently, when an instruction to collect the measurement data and the like of the sensor units 4a–4d is transmitted from the host computer unit 6, the communication controller unit 57 transmits a mode signal from either TMS terminal 57e or f to switch the respective boundary scan elements 76 to a required operation mode, so that the respective boundary scan elements 76 are set with the detected data and the like of the measurement data and the like from the corresponding sensor unit 4a–4d ; thereafter, the detected data and the like set in the respective boundary scan elements 76 are transferred through the clockwise communication lines 65 and 66 to the clockwise input terminal 57b of the communication controller unit 57. After that, the host computer unit 6 or the communication controller unit 57 carries out the analysis or the like of the detected data and the like received.

When the communication lines 56 suffer breakage at a portion thereof, e.g. between the boundary scan element groups 55b and 55c, in the middle of the above-described communication processing by driving the boundary scan elements 76 alone, it becomes impossible for the communication controller unit 57 to transmit control data to the sensor units 4c and 4d, as well as to receive the detected data or the status data from the sensor units 4a and 4b.

In this case, based on the missing of the detected data or the status data of the sensor units 4a and 4b among the communication data received through the clockwise input terminal 57b, the communication controller unit 57 can identify the presence of breakage and the position of the breakage.

Here, since the boundary scan elements 77 are reversed in the direction of transfer of communication data from the boundary scan elements 76, it is possible for the communication controller unit 57 to receive the detected data or the status data of the sensor units 4a and 4b and to transfer communication data to the sensor units 4a and 4d, through the intermediary of these boundary scan elements 77.

Therefore, the communication controller unit 57 transmits a mode signal from either TMS terminal 57e or f to drive the boundary scan elements 77 instead of the boundary scan elements 76, thereby setting the respective boundary scan elements 77 with the detected data or status data of the sensor units 4a and 4b. Then, the detected data or the like of the sensor units 4a and 4b set in the respective boundary scan elements 77 are transferred through the counterclockwise communication lines 68 and 69 to the counterclockwise input terminal 57d of the communication controller unit 57.

Similarly, the communication controller unit 57 can also transmit new control data to the sensor units 4d and 4c by transmitting the new control data from the counterclockwise output terminal 57c through the counterclockwise communication lines 67 and 68 to the boundary scan elements 77 in the boundary scan element groups 55d and 55c.

Accordingly, it becomes possible for the communication controller unit 57 to transmit/receive communication data to/from all the sensor units 4a–4d even when a part of the communication lines 56 suffers breakage.

Thus, since, in the communication system 1b, the respective sensor units 4a–4d are connected with the boundary scan element groups 55a–55d having two boundary scan elements 76, 77, and the respective boundary scan elements 76, 77 are reversed from each other in the direction of transfer of communication data, it is possible to transmit communication data to the respective sensor units 4a–4d and receive communication data from the respective sensor units 4a–4d even when the communication lines 56 suffer breakage.

What is claimed is:

1. A communication system comprising:
   a plurality of boundary scan elements, each boundary scan element including a plurality of boundary cells individually assigned to respective input terminals and output terminals, a TAP circuit for controlling input and output of data to or from said boundary cells, a TDI terminal for inputting serial data to be supplied to said boundary cells, a TDO terminal for outputting data from said boundary cells as serial data, a TCK terminal to which a clock signal is input, and a TMS terminal to which a mode signal for switching the operation mode of said TAP circuit is input;
   a plurality of terminal units connected to said respective boundary scan elements or provided with ICs into which the elements are incorporated;
   a communication controller, connected in series with said boundary scan elements, for transmitting/receiving through said boundary scan elements communication data for individually controlling said terminal units; and a cable provided to establish connections between said boundary scan elements adjoining each other and between said boundary scan elements and said communication controller, said cable being formed by binding up a clock signal line, a mode signal line, an outgoing communication line, and incoming communication lines, wherein said incoming communication lines establish individual connections such that the TDO terminal of one of the boundary scan elements positioned at a backmost as seen from said communication controller is connected with the TDI terminal of another of the boundary scan elements positioned at a side nearer to said communication controller than said one at the backmost, and a data input terminal of said communication controller and the TDO terminal of another of the boundary scan elements positioned nearest said communication controller are directly connected with said communication controller at an end portion of said incoming communication lines through a cable, and said outgoing communication line establishes a connection between a data output terminal of said communication controller and said TDI terminal of said boundary scan element positioned at the backmost as seen from said communication controller.

2. A communication system according to claim 1, wherein said TDO terminal and said TDI terminal of said boundary scan elements adjoining each other are connected together.

3. A communication system comprising:

a plurality of boundary scan elements, each boundary scan element including a plurality of boundary cells individually assigned to respective input terminals and output terminals, a TAP circuit for controlling input and output of data to or from said boundary cells, a TDI terminal for inputting serial data to be supplied to said boundary cells, a TDO terminal for outputting data from said boundary cells as serial data, a TCK terminal to which a clock signal is input, and a TMS terminal to which a mode signal for switching the operation mode of said TAP circuit is input;

a plurality of terminal units connected to said boundary scan elements or provided with ICs into which the elements are incorporated; and a communication controller for transmitting/receiving through said boundary scan elements communication data for individually controlling said terminal units, wherein said terminal units each is connected with a boundary scan element group or provided with an IC into which the elements are incorporated, said boundary scan element group including two boundary scan elements having said input terminals and said output terminals separately connected in parallel, said communication controller includes two terminal areas comprising a communication data output terminal for transmitting communication data to said boundary scan elements and a communication data input terminal for receiving communication data from said boundary scan elements, and either one of said terminal areas and the other of said interminal areas are connected in series with either one of said boundary scan elements in said boundary scan element groups and the others of said boundary scan elements in said boundary scan element groups, respectively, so that directions of transfer of communication data are opposite to each other.

* * * * *